(12) United States Patent
Tsukude

(10) Patent No.: US 6,191,461 B1
(45) Date of Patent: Feb. 20, 2001

(54) SEMICONDUCTOR DEVICE INCLUDING OUTPUT CIRCUIT IMPROVED IN ELECTROSTATIC DAMAGE RESISTANCE

(75) Inventor: Masaki Tsukude, Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/113,150

(22) Filed: Jul. 10, 1998

(30) Foreign Application Priority Data

Jan. 12, 1998 (JP) ................................................. 10-003877

(51) Int. Cl.$^7$ ........................................................ H01L 23/62
(52) U.S. Cl. .............................................. 257/401; 257/355
(58) Field of Search ................................. 257/401, 355, 257/365, 364

(56) References Cited

U.S. PATENT DOCUMENTS 5,060,037   10/1991   Rountree .
5,365,103   11/1994   Brown et al. .
5,852,315 * 12/1998   Ker et al. .
5,955,763 *  9/1999   Lin .

FOREIGN PATENT DOCUMENTS

| 64-20651 | 1/1989 | (JP) . |
| 5-175432 | 7/1993 | (JP) . |
| 5-291503 | 11/1993 | (JP) . |
| 6-061439 | 3/1994 | (JP) . |
| 6-291257 | 10/1994 | (JP) . |

\* cited by examiner

*Primary Examiner*—Stephen D. Meier
(74) *Attorney, Agent, or Firm*—McDermott, Will & Emery

(57) ABSTRACT

A first transistor having a central impurity region connected to a power supply node and outer-side impurity regions connected to an output node and a second transistor having a central impurity region connected to the output node and outer-side impurity regions connected to the power supply node are so arranged that the impurity regions connected to the power supply node are adjacent to or faced to those connected to the output node. The layout area of an output circuit is reduced without reducing electrostatic damage resistance by parasitic field transistors.

13 Claims, 9 Drawing Sheets

US 6,191,461 B1

SEMICONDUCTOR DEVICE INCLUDING OUTPUT CIRCUIT IMPROVED IN ELECTROSTATIC DAMAGE RESISTANCE

BACKGROUND OF THE INVENTION

1. Field of the Invention

The present invention relates to a semiconductor device including MOS transistors (insulated gate field-effect transistors), and more specifically, it relates to a structure for improving the electrostatic damage resistance of an output circuit for externally outputting signals.

2. Description of the Prior Art

FIG. 20 schematically illustrates the structure of an output circuit employed in a general semiconductor device. Referring to FIG. 20, the output circuit includes an output drive circuit 900 for generating a signal to be outputted in accordance with an internal signal, and an output circuit final stage 902 for outputting a signal to an output node 904 in accordance with the output signal from the output drive circuit 900. The output node 904 is connected to an external pin terminal LP through a pad PD. The output circuit final stage 902 includes an n-channel MOS transistor N1 which is connected between a power supply node and the output node 904 and conducts, when the output signal from the output drive circuit 900 is at a high level, for driving the output node 904 to a power supply voltage VDD level, and an n-channel MOS transistor N2 which conducts, when the output signal from the output drive circuit 900 is at a high level, for discharging the output node 904 to the ground voltage level. Only one of these MOS transistors N1 and N2 conducts. In an output high impedance state, both of the MOS transistors N1 and N2 enter non-conducting states.

The output circuit final stage 902 is required to charge/discharge the output node 904 at a high speed. This output node 904 is connected to the external pin terminal LP through the pad PD, and the transistors N1 and N2 have relatively large current drivability due to the necessity for charging/discharging a large load at a high speed.

However, the output node 904 is connected to the external pin terminal LP through the pad PD, and equivalently connected with an LCR circuit formed by a high inductance component L, a parasitic capacitance C, wiring resistance and parasitic resistance R by wiring resistance of an external circuit. In case of charging/discharging such LCR circuit at a high speed, ringing is caused at the output node 904 and it takes a long time for stabilizing the output signal. In order to generate the output signal at a high speed with no ringing, the output circuit final stage 902 charges/discharges the output node 904 over a plurality of stages.

FIG. 21 illustrates an exemplary structure of a conventional multistage-drive output circuit final stage. This FIG. 21 shows a circuit part for discharging the output node 904. A circuit for pulling up the output node 904 to a high level may include a similar structure for multistage driving, appropriately depending on circuit characteristics of the output node 904 such as the dominance of overshoot or undershoot in the output node 904.

Referring to FIG. 21, n-channel MOS transistors N2a and N2b are provided in parallel between ground node and the output node 904. Conduction/non-conduction of MOS transistors N2a and N2b is controlled in accordance with control signals $\phi 1$ and $\phi 2$ respectively. In the structure of the conventional multistage-drive output circuit final stage, the n-channel MOS transistor N2 of the output circuit final stage 902 shown in FIG. 20 is split into the two MOS transistors N2a and N2b. These two MOS transistors N2a and N2b conduct at different timings, thereby preventing the output node 904 from rapid discharge. This discharge operation is now described with reference to a waveform diagram shown in FIG. 22.

The control signal $\phi 1$ first rises from a low level to a high level so that the MOS transistor N2a conducts for relatively slowly discharging the output node 904. Then, the control signal $\phi 2$ rises from a low level to a high level, so that the MOS transistor N2b conducts. Thus, the two MOS transistors N2a and N2b discharge the output node 904, so that the voltage of the output signal rapidly falls to a low level. The control signal $\phi 2$ is activated at such a time that no undershoot is caused even by the rapid fall of the output signal from the output node 904. The activation timings for the control signals $\phi 1$ and $\phi 2$ may be simply decided using a delay circuit, or activation of the control signal $\phi 2$ may be controlled in response to the voltage level of the output node 904. In any case, the MOS transistors N2a and N2b for discharging the output node 904 conduct at different timings, thereby preventing rapid discharge of the output node 904 at a relatively high voltage level with a large discharge current. Alternatively, the voltage level of the output node 904 may be first reduced by high-speed discharge, and then the output node 904 is discharged at a low speed. Thus, the output signal can be stabilized at a faster timing with no undershoot.

The output node 904 is connected to the external pin terminal LP through the pad PD. The external pin terminal LP is connected to an external environment. Electrostatic discharge may be caused in the output node 904 through the external pin terminal LP. The cause for such electrostatic discharge may be the human body, a package insertion apparatus, a system operation or thunder. Such electrostatic discharge in the output node 904 may result in damage of gate insulating films of the MOS transistors N1 and N2 of the output circuit final stage 902, or a large current flow (in amperes) caused by this electrostatic discharge may damage interconnection lines or P-N junctions. In order to prevent electrostatic discharge damage (ESD) caused by such electrostatic discharge, the output circuit final stage 902 must satisfy the specification value of ESD resistance. To this end, elements for improving the ESD resistance are added with respect to the output node 904.

FIG. 23 schematically illustrates the planar layout of the output circuit final stage shown in FIG. 21. Referring to FIG. 23, high-concentration N-type impurity regions 901, 902, 903, 904, 905 and 906 of low resistance are arranged alignedly with each other. Gate electrode layers 907 and 908 are arranged between the impurity regions 901 and 902 and between the impurity regions 902 and 903 respectively. Gate electrode layers 909 and 910 are arranged between the impurity regions 904 and 905 and between the impurity regions 905 and 906 respectively. The gate electrode layers 907 and 908 are connected to receive the control signal 41, and the gate electrode layers 909 and 910 are connected to receive the control signal $\phi 2$.

The impurity regions 901 and 903 are connected to the output node through contact holes CT, and the impurity region 902 is connected to a power supply node (ground node) through contact holes CT. The impurity regions 904 and 906 are connected to the output node through contact holes CT, and the impurity region 905 is connected to the power supply node (ground node) through contact holes CT.

The impurity regions 901, 902 and 903 and the gate electrode layers 907 and 908 form the MOS transistor N2a, and the impurity regions 904, 905 and 906 and the gate electrode layers 909 and 910 form the MOS transistor N2b. Two MOS transistors are connected in parallel with each other, to form each MOS transistor. Thus, a MOS transistor formed by the impurity regions 901 and 902 and the gate electrode layer 907 and that formed by the impurity regions 902 and 903 and the gate electrode layer 908 are connected in parallel with each other, thereby implementing the MOS transistor N2a having high current drivability.

In order to improve electrostatic damage resistance against electrostatic discharge on the output node (the output node 904 shown in FIG. 21) connected with the MOS transistors N2a and N2b, impurity regions 911 to 919 connected to the power supply node (ground node) through contact holes are so arranged as to enclose the impurity regions 901, 903, 904 and 906 connected to the output node. The impurity regions 911, 912 and 913 enclose the impurity region 901. The impurity regions 914, 915 and 916 enclose the impurity regions 903 and 904. The impurity regions 917, 918 and 919 enclose the impurity region 906. These additional impurity regions 911 to 919 are faced to the corresponding impurity regions 901, 903, 904 and 906 connected to the output node through thick field insulating films. These impurity regions 911 to 919 are connected to the power supply node. Thus, the additional impurity regions 911 to 919 form so-called field transistors with the corresponding impurity regions 901, 903, 904 and 906 connected to the output node.

FIG. 24 schematically illustrates the structure of a field transistor. Referring to FIG. 24, the field transistor includes high-concentration N-type impurity regions 921 and 922 formed spacedly on a surface of a P-type semiconductor substrate region 920, and a thick field insulating film 923 formed between these impurity regions 921 and 922. The impurity region 922 is connected to the output node 904, and the impurity region 921 is connected to the power supply node (ground node). When a positive voltage is applied to the output node 904 by electrostatic discharge, a lateral parasitic bipolar transistor formed by the impurity regions 921 and 922 and the substrate region 920 conducts by avalanche breakdown by a high electric field in the impurity region 922, to absorb electrostatic charges supplied to the output node 904. The impurity region 922 corresponds to the impurity regions 901, 903, 904 and 906 connected to the output node shown in FIG. 23, and the impurity region 921 corresponds to any of the additional impurity regions 911 to 919.

This field transistor absorbs an abnormal high voltage by turning-on of the lateral parasitic bipolar transistor resulting from avalanche breakdown in the impurity region 922. A ground line may be arranged on the field insulating film 923 as a gate electrode of an aluminum gate field transistor. In this case, a diode-connected MOS transistor having a large threshold voltage is equivalently connected to the output node 904, for absorbing a negative surge voltage applied thereto. In the field transistor having no gate electrode, the parasitic bipolar transistor conducts by a reverse-directional avalanche breakdown when a large negative surge voltage is applied to the output node 904, to absorb the abnormal negative surge voltage.

As shown in FIG. 23, the additional impurity regions 911 to 919 connected to the power supply node enclose the impurity regions 901, 903, 904 and 906 connected to the output node for forming a field transistor, thereby preventing the output node from electrostatic damage caused by electrostatic discharge.

As hereinabove described, the impurity regions connected to the power supply node are arranged to enclose the impurity regions connected to the output node, thereby forming a field transistor and improving the ESD resistance. The channel length of the field transistor is made not longer than 3 μm, to implement high-speed response of turning-on of a parasitic bipolar transistor resulting from avalanche breakdown. In order to absorb a large current, the impurity regions 911 to 919 must have sufficient areas. The impurity regions 911 to 919 are connected in parallel with each other, to implement a large field transistor as a whole.

However, the impurity regions 911 to 919 must be arranged to enclose the output circuit final stage, and hence the occupying area of the output circuit final stage is disadvantageously increased. Particularly when a semiconductor memory device has a great data output bit number of 16 or 32, for example, the number of output circuits is increased accordingly, to remarkably hinder high integration.

Particularly when a similar field transistor is arranged for charging MOS transistors in addition to the field transistor for discharging MOS transistors, the occupying area of the output circuit final stage is further increased to extremely hinder high integration.

SUMMARY OF THE INVENTION

An object of the present invention is to provide a semiconductor device which can be reduced in occupying area without reducing electrostatic damage resistance.

Another object of the present invention is to provide an output circuit which can be reduced in layout area without reducing electrostatic damage resistance.

Briefly stating, the semiconductor device according to the present invention is formed by arraying transistor elements such that impurity regions connected to a prescribed node such as an output node and impurity regions connected to a reference voltage source such as a power supply node are arranged alternately in a device including a plurality of transistors. Thus, a field transistor is parasitically formed, and no additional impurity region is required for forming the field transistor, and the occupied area can be reduced.

The transistors are so arrayed that impurity regions connected to different nodes are adjacent to each other. Each transistor is enclosed with a field insulating film, to be isolated from the other transistors. Due to the aforementioned arrangement, a field transistor is parasitically formed between the adjacent transistors. Thus, no dedicated impurity region for forming the field transistor need be provided on the transistor arrangement region, and hence the layout area is reduced. Further, the parasitic field transistor guarantees electrostatic damage resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1A:
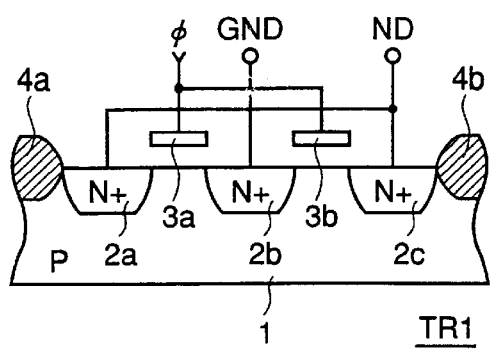
FIGS. 1A and 1B illustrate the sectional structure and the planar layout of a first transistor respectively.

FIG. 1A schematically illustrates the sectional structure of a first transistor TR1 employed in an embodiment 1 of the present invention. Referring to FIG. 1A, the first transistor TR1 includes high-concentration N-type impurity regions $2a$, $2b$ and $2c$ arranged spacedly on a surface of a P-type semiconductor substrate 1, a gate electrode layer $3a$ formed on a channel region between the impurity regions $2a$ and $2b$ with a gate insulating film (not shown) underlaid, and a gate electrode layer $3b$ formed on a channel region between the impurity regions $2b$ and $2c$ with a gate insulating film (not shown) underlaid. Field insulating films $4a$ and $4b$ for isolation from other transistor elements are formed in the exterior of the impurity regions $2a$ and $2c$. The gate electrode layers $3a$ and $3b$ are connected to receive a control signal φ in common, and the impurity region $2b$ is connected to a power supply node (ground node) GND.

Figure 1B:
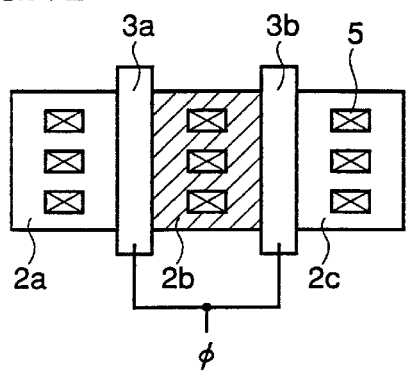

FIG. 1B illustrates the planar layout of the first transistor TR1 shown in FIG. 1A. As shown in FIG. 1B, the impurity regions $2a$ and $2c$ outside the gate electrode layers $3a$ and $3b$ receiving the control signal φ are arranged on both sides of the impurity region $2b$ connected to the power supply node GND. The gate electrode layer $3a$ is arranged between the impurity regions $2a$ and $2b$, and the gate electrode layer $3b$ is arranged between the impurity regions $2b$ and $2c$. The impurity regions $2a$, $2b$ and $2c$ are connected to the corresponding node ND through contact holes 5.

Figure 2A:
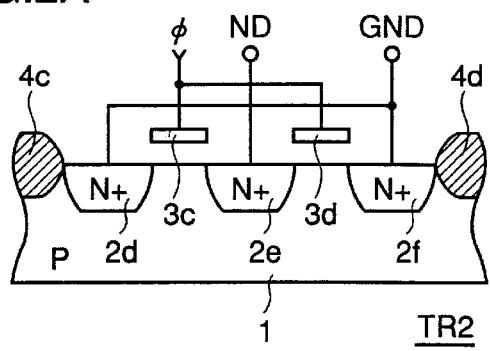
FIG. 2A illustrates the sectional structure of a second transistor, and FIG. 2B schematically illustrates the planar layout of the structure shown in FIG. 2A.

FIG. 2A schematically illustrates the sectional structure of a second transistor TR2 employed in the embodiment 1 of the present invention. Referring to FIG. 2A, the second transistor TR2 includes high-concentration N-type impurity regions $2d$, $2e$ and $2f$ formed spacedly on the surface of the P-type semiconductor substrate region 1, a gate electrode layer $3c$ formed on a channel region between the impurity regions $2d$ and $2e$ with a gate insulating film (not shown) underlaid, and a gate electrode layer $3d$ formed on a channel region between the impurity regions $2e$ and $2f$ with a gate insulating film (not shown) underlaid. Field insulating films $4c$ and $4d$ for isolation from other transistor elements are arranged in the exterior of the impurity regions $2d$ and $2f$.

The gate electrode layers $3c$ and $3d$ are connected to receive the control signal φ, and the impurity regions $2d$ and $2f$ are connected to the power supply node (ground node) GND. The impurity region $2e$ is connected to the prescribed node ND.

Figure 2B:
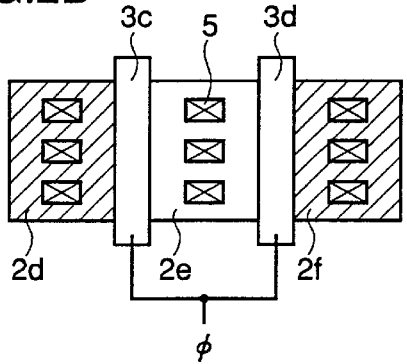

FIG. 2B illustrates the planar layout of the second transistor TR2 shown in FIG. 2A. As shown in FIG. 2B, the impurity regions $2d$ and $2f$ connected to the power supply node GND are arranged adjacently to both sides of the impurity region $2e$ connected to the prescribed node ND. The gate electrode layer $3c$ is arranged between the impurity regions $2d$ and $2e$, and the gate electrode layer $3d$ is arranged between the impurity regions $2e$ and $2f$. These impurity regions $2d$, $2e$ and $2f$ are connected to the corresponding nodes GND and ND through contact holes 5.

As shown in FIGS. 1B and 2B, each of the first and second transistors TR1 and TR2 is formed by parallel connection of two MOS transistors, while the positions of the impurity regions $2b$, $2d$ and $2f$ connected to the power supply node GND are different from each other. In these transistors TR1 and TR2, the field insulating films $4a$ and $4b$ are formed along the peripheries of the impurity regions $2a$, $2b$ and $2c$, and the field insulating films $4c$ and $4d$ are formed to enclose the peripheries of the impurity regions $2d$, $2e$ and $2f$. The first and second transistors TR1 and TR2 are alternately arranged so as to form a parasitic field transistor. The embodiment 1 is now described. In the following description, the contact holes 5 for electrically connecting the impurity regions to the corresponding node are omitted for simplifying the illustration. It is assumed that the impurity regions are identical in size to each other.

Figure 3:
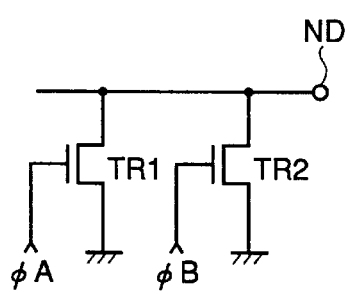
FIG. 3 illustrates an electric equivalent circuit of a semiconductor device according to an embodiment 1 of the present invention.

FIG. 3 illustrates an electric equivalent circuit of a semiconductor device according to the embodiment 1 of the present invention. Referring to FIG. 3, the semiconductor device according to the embodiment 1 of the present invention includes first and second transistors TR1 and TR2 connected in parallel between an output node ND and power supply node (ground node). The gates of these transistors TR1 and TR2 are supplied with control signals φA and φB respectively.

The semiconductor device shown in FIG. 3 is an output circuit final stage, and the node ND is connected to an external pin terminal through a pad (not shown). The control signals φA and φB are activated at different timings, for suppressing ringing (undershoot) of the node ND upon outputting of a signal.

Figure 4:
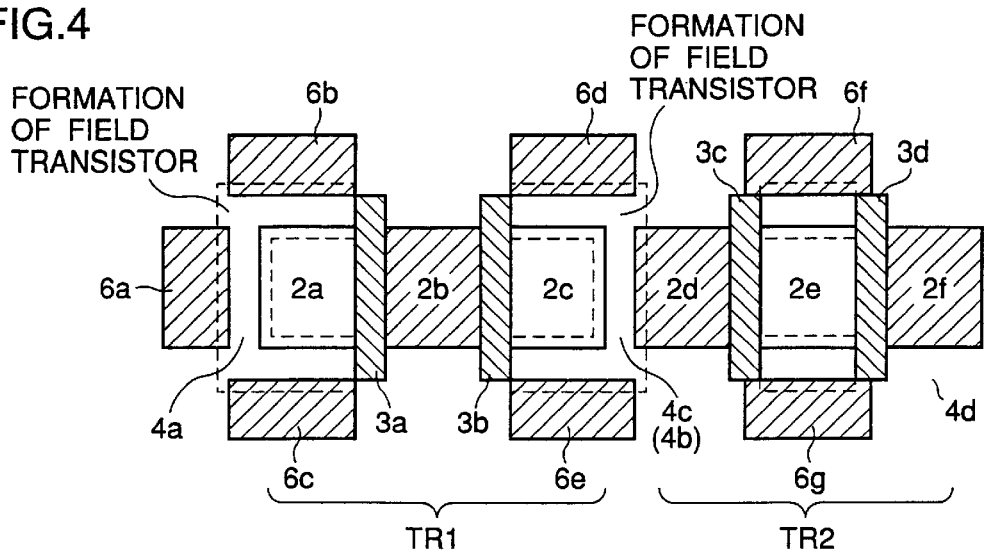
FIG. 4 schematically illustrates the planar layout of the semiconductor device according to the embodiment 1 of the present invention.

FIG. 4 schematically illustrates the plane layout of the semiconductor device shown in FIG. 3. Referring to FIG. 4, the transistors TR1 and TR2 are arranged alignedly with each other. Field insulating films 4a and 4c (4b) enclose these transistors TR1 and TR2. Impurity regions 6a to 6g connected to power supply node (ground node) are arranged enclosing the impurity regions 2a, 2c and 2e of these transistors TR1 and TR2 connected to the output node ND. The impurity regions 6a to 6c enclose the impurity region 2a, and the impurity regions 6d and 6e enclose the impurity region 2c. The impurity region 2d of the transistor TR2 is arranged adjacently to the impurity region 2c with the field insulating film 4c (4b) placed therebetween. The impurity regions 6f and 6g enclose the impurity region 2e of the transistor TR2.

Thus, the impurity regions 2a, 2c and 2e connected to the node ND (see FIG. 3) are faced to the adjacently arranged impurity regions 6a to 6e connected to the power supply node, and field transistors are formed in these regions as shown by broken lines. The impurity region 2c of the first transistor TR1 connected to the output node ND is arranged adjacently to the impurity region 2d of the second transistor TR2 connected to the power supply node with the field insulating film 4c (4b) placed therebetween. Therefore, the field transistor shown by the broken lines is parasitically formed between the impurity regions 2c and 2d. Thus, no additional impurity region need be formed between the transistors TR1 and TR2, whereby the circuit occupying area is reduced. Particularly when the number of the transistors forming this output final stage is increased, the layout area can be advantageously reduced by alternately arranging the first and second transistors TR1 and TR2 in an aligned manner.

In the embodiment 1 of the present invention, the first and second transistors TR1 and TR2 receive the different control signals φA and φB at the gate electrode layers 3a to 3d. Alternatively, the gate electrode layers 3a to 3d may receive the same control signal, and one of the gate electrode layers 3a to 3d (e.g., 3a) may receive one of the control signals φA and φB while the other gate electrode layers (e.g., 3b to 3d) may receive the other control signal. When the number of interconnected gate electrode layers is increased, an increased number of MOS transistors are connected in parallel with each other, whereby the channel width as well as the current drivability are increased. Therefore, connection of the gate electrode layers may be appropriately made in response to the control mode of the charge/discharge speed of the output node ND.

According to the embodiment 1 of the present invention, as hereinabove described, the first transistor having the outer-side impurity regions connected to the prescribed node (output node) and the second transistor having the outer-side impurity regions connected to the power supply node are arranged alignedly with each other, whereby a field transistor is parasitically formed between the first and second transistors with no requirement for an impurity region (diffusion layer) for forming the field transistor and the layout area can be reduced.

[Embodiment 2]

Figure 5:
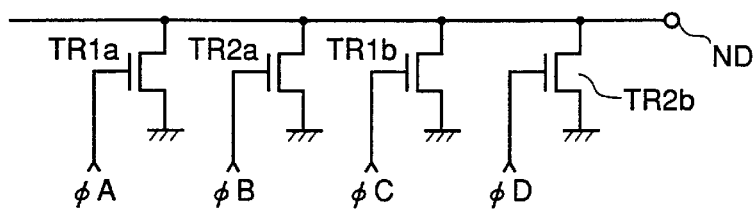
FIG. 5 illustrates an electric equivalent circuit of a semiconductor device according to an embodiment 2 of the present invention.

FIG. 5 illustrates an electric equivalent circuit of a semiconductor device according to an embodiment 2 of the present invention. Referring to FIG. 5, the semiconductor device according to the embodiment 2 of the present invention includes n-channel MOS transistors TR1a, TR2a, TR1b and TR2b connected in parallel between an output node ND and power supply node (ground node) and receiving control signals φA, φB, φC and φD at the gates thereof respectively. In the embodiment 2 of the present invention, an output drive transistor is split into four MOS transistors.

Figure 6:
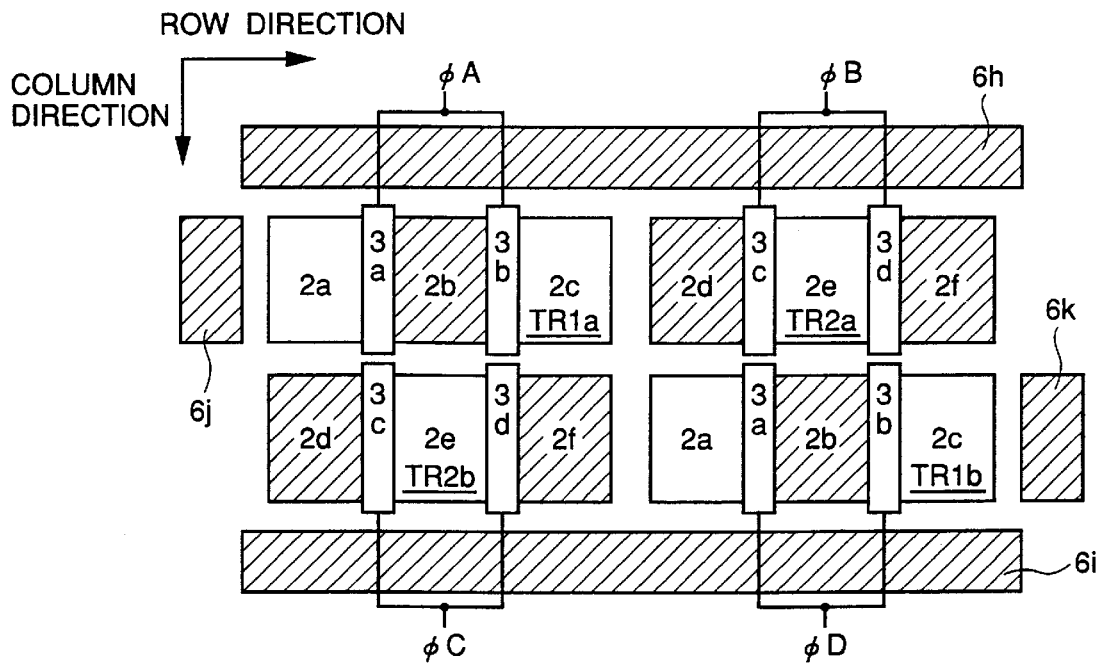
FIG. 6 schematically illustrates the planar layout of the semiconductor device according to the embodiment 2 of the present invention.

FIG. 6 schematically illustrates the planar layout of the semiconductor device according to the embodiment 2 of the present invention. Referring to FIG. 6, each of the transistors TR1a and TR1b is formed by the first transistor TR1 shown in FIGS. 1A and 1B, and each of the transistors TR2a and TR2b is formed by the second transistor TR2 shown in FIGS. 2A and 2B. The transistors TR1a and TR2a are aligned with each other along the horizontal direction in FIG. 6, and the transistors TR2b and TR1b are also aligned with each other along the horizontal direction. Further, the first transistor TR1a and the second transistor TR2b are aligned with each other along the vertical direction in FIG. 6, and the transistors TR2a and TR1b are also aligned with each other along the vertical direction.

Namely, the first and second transistors TR1 and TR2 are aligned with each other along the row and column directions (the horizontal and vertical directions). Thus, a field insulating film provided between impurity regions 2c and 2d parasitically forms a field transistor for the transistors TR1a and TR2a, while a field insulating film provided between impurity regions 2f and 2a forms a parasitic field transistor for the transistor TR2b and TR1b.

The impurity regions 2a and 2c of the transistor TR1a connected to the output node ND are faced to the impurity regions 2d and 2f of the transistor TR2b connected to the power supply node through field insulating films, and field transistors are also formed parasitically in these regions. An impurity region 2b of the transistor TR1a connected to the power supply node is faced to an impurity region 2e of the transistor TR2b connected to the output node ND, and a field transistor is also formed parasitically in this region.

Similarly, as for the transistors TR2a and TR1b, impurity regions 2d, 2f and 2b connected to the power supply node are faced to impurity regions 2a, 2c and 2e connected to the output node ND through field insulating films respectively. Thus, field transistors are parasitically formed also in the regions between the transistors TR2a and TR1b.

Gate electrodes 3a and 3b, 3c and 3d, 3c and 3d and 3a and 3b of the transistors TR1a, TR2a, TR2b and TR1b are connected to receive the control signals φA, φB, φC and φD respectively.

An impurity region 6h connected to the power supply node horizontally extends in the exterior of the transistors TR1a and TR2a with a field insulating film arranged therebetween, while an impurity region 6i connected to the power supply node (ground node) horizontally extends in the exterior of the transistors TR2b and TR1b with a field insulating film arranged therebetween. An impurity region 6j connected to the power supply node is arranged adjacently to the impurity region 2a of the transistor TR1a connected to the output node ND in the horizontal direction of this figure, while an impurity region 6k connected to a power supply node is formed adjacently to the impurity region 2c of the transistor TR1b connected to the output node ND in the horizontal direction.

When the output transistor is split into the four transistors TR1a, TR2a, TR1b and TR2b as shown in FIG. 6, no dedicated impurity regions connected to power supply node for forming field transistors need be arranged between these transistors TR1a, TR2a, TR1b and TR2b, and the layout area is remarkably reduced. It is only necessary to simply arrange the impurity regions 6h to 6k to enclose these transistors TR1a, TR2a, TR1b, for forming the field transistors.

In the arrangement shown in FIG. 6, the layout area can be further advantageously reduced by repetitively arranging the first and second transistors TR1 and TR2 alternately along the horizontal and vertical directions by a necessary number.

Also in the structure shown in FIG. 6, the gate electrode layers 3a to 3d of the transistors TR1a, TR1b, TR2a and TR2b are connected to receive the different control signals φA, φB, φC and φD respectively. Alternatively, all gate electrode layers 3a to 3d may be connected to receive the same control signal, or three gate electrode layers over two transistor elements may be supplied with a single control signal. Connection of the gate electrodes may be determined so as to appropriately adjust the current drivability depending on the control mode for charging/discharging the output node ND.

According to the embodiment 2 of the present invention, as hereinabove described, the second transistors having the outer-side impurity regions connected to the power supply node and the first transistors having the outer-side impurity regions connected to the prescribed node are alternately arranged in the horizontal and vertical directions, whereby no dedicated impurity regions connected to power supply node for forming field transistors need be arranged between the transistors, and the layout area is remarkably reduced.

[Embodiment 3]

Figure 7:
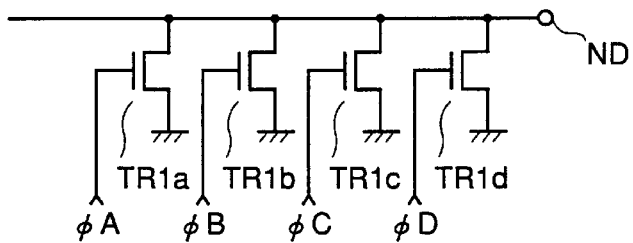
FIG. 7 illustrates an electric equivalent circuit of a semiconductor device according to an embodiment 3 of the present invention.

FIG. 7 illustrates an electric equivalent circuit of a semiconductor device according to an embodiment 3 of the present invention. Referring to FIG. 7, this semiconductor device is an output circuit final stage including n-channel MOS transistors TR1a to TR1d connected in parallel between an output node ND and a power supply node (ground node). These four MOS transistors TR1a to TR1d are supplied with control signals φA, φB, φC and φD at the gates thereof respectively. Each of the MOS transistors TR1a to TR1d is formed by the first transistor TR1 shown in FIGS. 1A and 1B.

Figure 8:
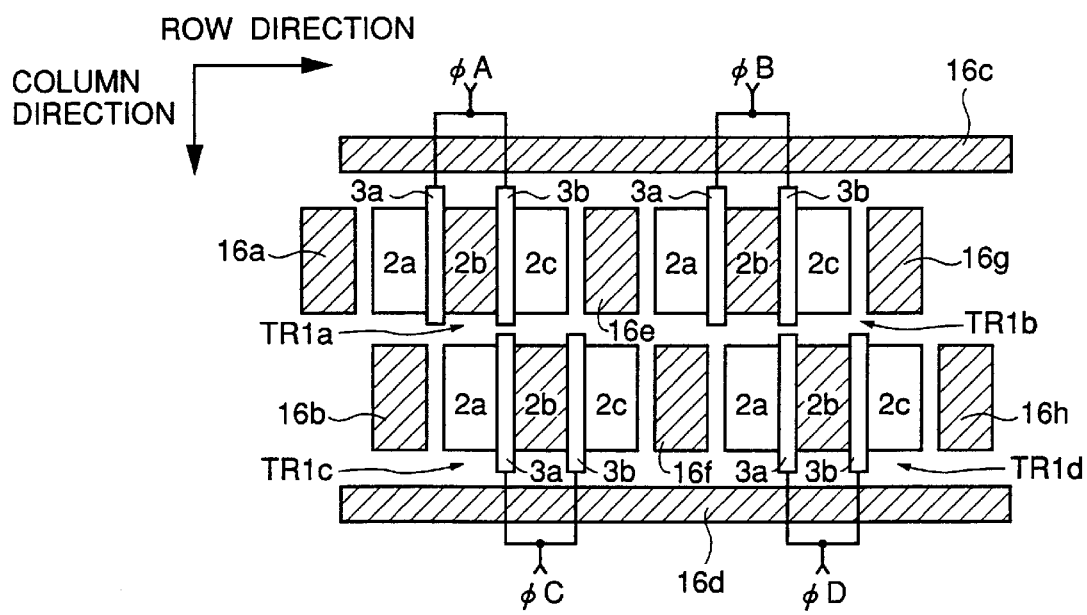
FIG. 8 schematically illustrates the planar layout of the semiconductor device according to the embodiment 3 of the present invention.

FIG. 8 schematically illustrates the planar layout of the semiconductor device according to the embodiment 3 of the present invention. Referring to FIG. 8, the transistors TR1a and TR1b are arranged alignedly with each other along the horizontal direction, and the transistors TR1c and TR1d are arranged along the horizontal direction such that impurity regions 2a of the transistors TR1c and TR1d connected to the output node ND are faced to impurity regions 2b of the transistors TR1a and TR1b connected to the power supply node. An impurity region 16e connected to the power supply node is arranged for forming a field transistor between the transistors TR1a and TR1b, and an impurity region 16f connected to the power supply node is arranged for forming a field transistor between the transistors TR1c and TR1d.

Impurity regions 16a and 16b connected to the power supply node for forming a field transistor are arranged adjacently to the impurity regions 2a of the transistors TR1a and TR1c respectively, and impurity regions 16g and 16h connected to the power supply node for forming field transistors are arranged adjacently to impurity regions 2c of the transistors TR1b and TR1d connected to the output node ND respectively. An impurity region 16c for forming a field transistor is arranged in the exterior of the transistors TR1a and TR1b along the horizontal direction, and an impurity region 16d for forming a field transistor is arranged in the exterior of the transistors TR1c and TR1d along the horizontal direction.

The transistors TR1a to TR1d are isolated from each other by field insulating films. In the vertical direction, the impurity regions 2b and 2c of the transistor TR1a are faced to the impurity regions 2a and 2b of the transistors TR1c respectively and isolated from each other by the field insulating films, and a field transistor is parasitically formed. Further, the impurity regions 2b and 2c of the transistor TR1b are faced to the impurity regions 2a and 2b of the transistor TR1d with the field insulating films arranged therebetween respectively. Thus, a field transistor is parasitically formed also in these regions. Therefore, while impurity regions for forming field transistors are needed to be arranged between the transistors arranged along the horizontal direction, no such impurity regions for forming field transistors need be arranged between the vertically adjacent transistors. Thus, the layout area can be reduced also in case of arranging the transistors in two rows and two columns.

In the structure shown in FIG. 8, an output transistor can be split into a larger number of transistor elements by repeating the same pattern in the horizontal and vertical directions. In this case, the layout area can be further advantageously reduced.

In the structure shown in FIG. 8, gate electrode layers 3a and 3b of the transistors TR1a, TR1b, TR1c and TR1d are connected to receive control signals φA, φB, φC and φD respectively. Alternatively, the control signals φA, φB, φC and φD may be properly dispersed to the gate electrode layers 3a and 3b for appropriately adjusting the current drivability depending on the control mode of the charge/discharge speed at the output node ND.

[Modification]

Figure 9:
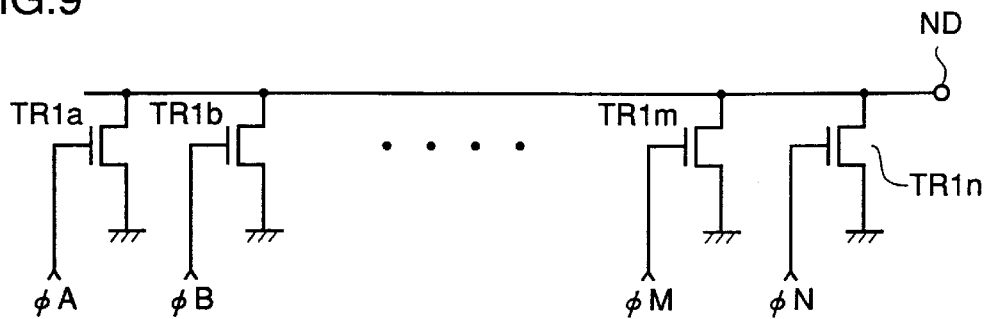
FIG. 9 illustrates an electric equivalent circuit of a modification of the semiconductor device according to the embodiment 3 of the present invention.

FIG. 9 illustrates an electric equivalent circuit of a modification of the semiconductor device according to the embodiment 3 of the present invention. Referring to FIG. 9, this semiconductor device (the final stage of an output circuit) includes n-channel MOS transistors TR1a, TR1b, . . . , TR1m and TR1n connected between an output node ND and power supply node (ground node) in parallel with each other and receiving control signals φA, φB, . . . φM and φN at the gates thereof respectively. Each of the transistors TR1a to TR1n is formed by the first transistor TR1 shown in FIGS. 1A and 1B.

Figure 10:
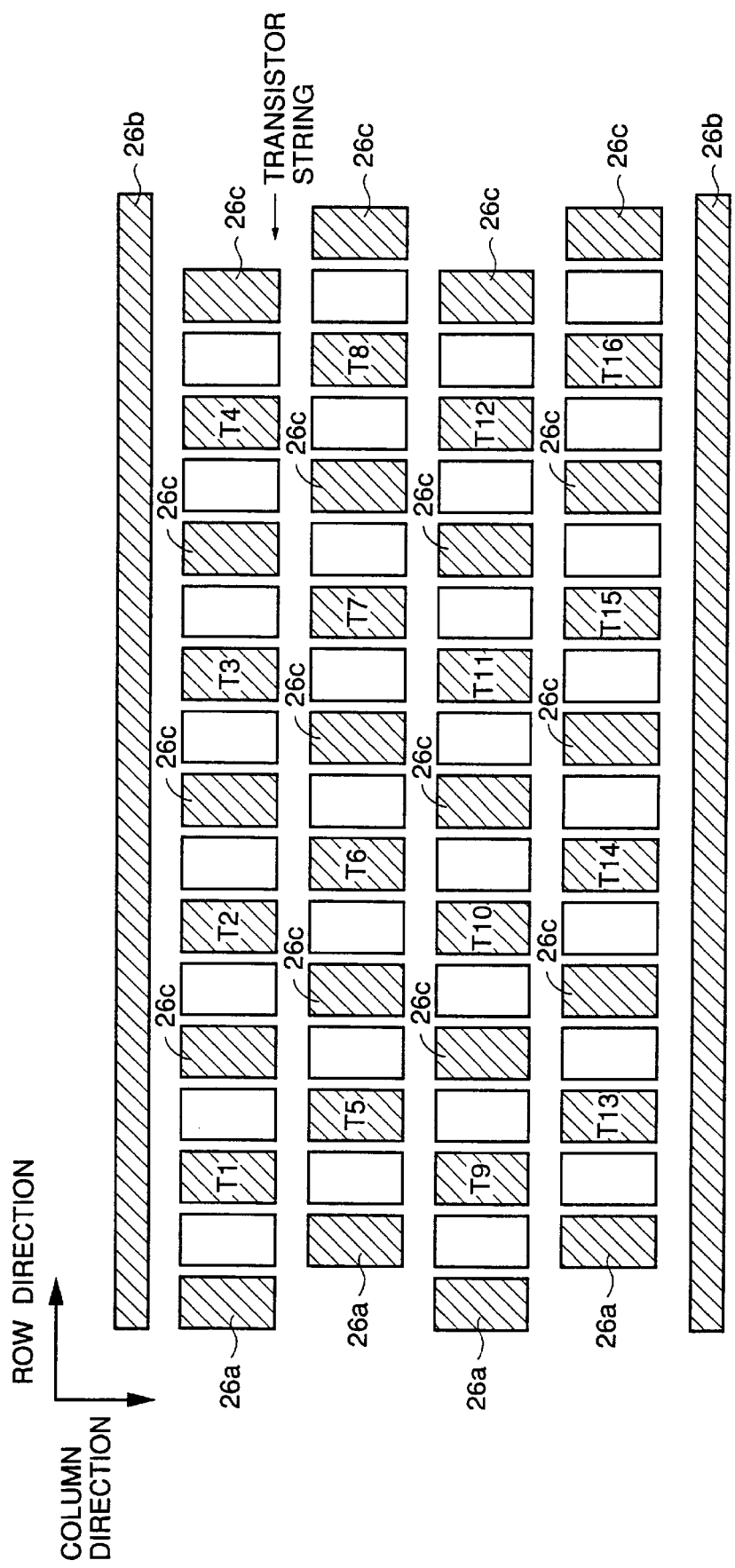
FIG. 10 schematically illustrates the planar layout of the modification of the semiconductor device according to the embodiment 3 of the present invention.

FIG. 10 illustrates the planar layout of the semiconductor device shown in FIG. 9. FIG. 10 illustrates as an example, the planar layout of 16 transistors TR1 to TR16 which are arranged in four rows and four columns as the transistors TR1a to TR1n. Each of the transistors TR1 to TR16 is formed by the first transistor TRI shown in FIGS. 1A and 1B having the central impurity region connected to the power supply node and the outer-side impurity regions connected to the output node ND.

Referring to FIG. 10, the transistors T1 to T4, T5 to T8, T9 to T12 and T13 to T16 are aligned with each other along the row direction respectively. In the transistors T1 to T16, any two transistors adjacent to each other along the column direction are displaced in the horizontal direction by a single impurity region. In other words, the arrangement of the transistors T1 to T16 shown in FIG. 10 is equivalent to that obtained by expanding the arrangement of the transistors TR1a to TR1d shown in FIG. 8 to the 16 transistors arranged in four rows and four columns. Impurity regions 26c connected to the power supply node for forming field transistors are arranged between the transistors in transistors T1 to T16 aligned with each other along the row direction, and impurity regions 26a and 26c connected to the power supply node for forming field transistors are arranged adjacently to the impurity regions connected to the output node ND of the respective transistor strings. Impurity regions 26b connected to the power supply node for forming field transistors extend in the exterior of the transistors T1 to T4 and T13 to T16 along the row direction respectively.

Between the transistor strings adjacent to each other in the column direction, the transistors are displaced from each other by a single impurity region as shown in FIG. 10. Each of the transistors T1 to T16 has outer-side impurity regions connected to the output node ND and a central impurity region connected to the power supply node. In these transistor strings, the impurity regions 26c for forming field transistors are arranged between the adjacent transistors. Between the adjacent transistor strings, the impurity regions connected to the output node ND of the transistors T1 to T16 are faced to the impurity regions connected to the power supply node of the corresponding transistors or to the impurity regions 26c for forming field transistors, and parasitic field transistors are formed. Therefore, no additional impurity regions for forming field transistors need be arranged between the transistor strings, and the layout area is remarkably reduced.

According to the embodiment 3 of the present invention, as hereinabove described, a plurality of first transistors having outer-side impurity regions connected to an output node are arranged to be displaced from each other by a single impurity region between adjacent transistor strings, whereby no dedicated impurity regions for forming additional field transistors need be provided between the transistor strings, and the layout area is remarkably reduced.

[Embodiment 4]

Figure 11:
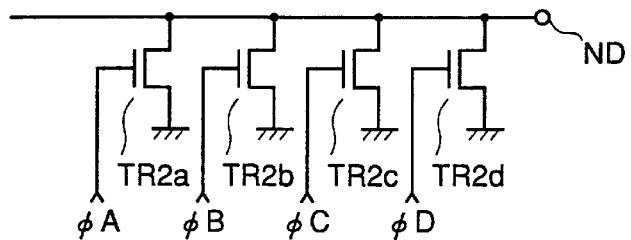
FIG. 11 illustrates an electric equivalent circuit of a semiconductor device according to an embodiment 4 of the present invention.

FIG. 11 illustrates an electric equivalent circuit of a semiconductor device according to an embodiment 4 of the present invention. Referring to FIG. 11, the semiconductor device (output circuit final stage) includes n-channel MOS transistors TR2a to TR2d connected between an output node ND and a ground node in parallel with each other and receiving control signals φA to φD at the gates thereof respectively. Each of the transistors TR2a to TR2d is formed by the second transistor TR2 shown in FIGS. 2A and 2B.

Figure 12:
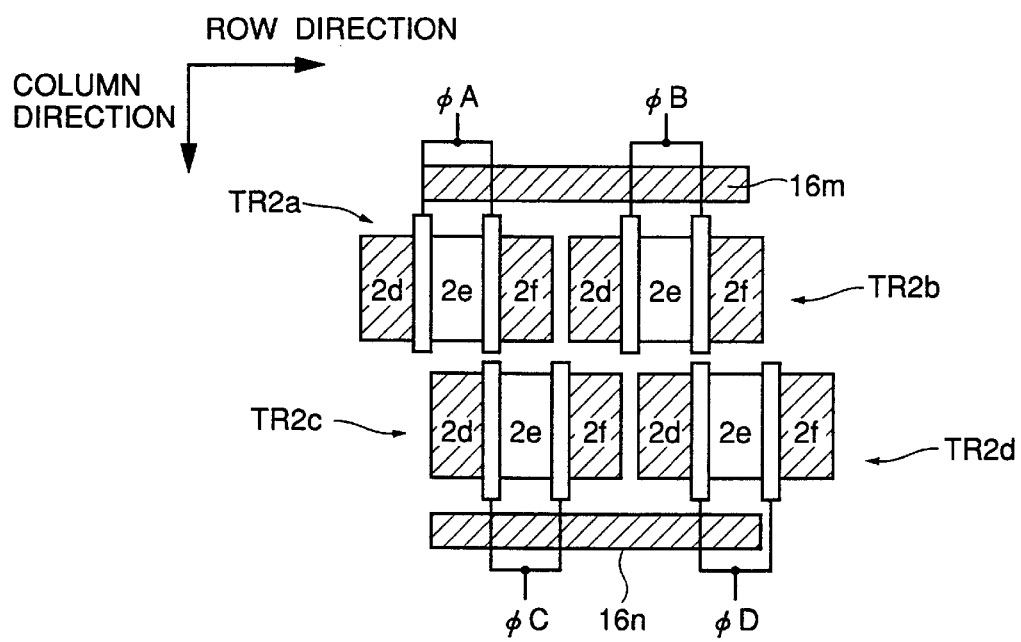
FIG. 12 schematically illustrates the planar layout of the semiconductor device according to the embodiment 4 of the present invention.

FIG. 12 illustrates the planar layout of the circuit shown in FIG. 11. Referring to FIG. 12, the transistors TR2a to TR2d are arranged in two rows and two columns. The transistors TR2a and TR2b are aligned with each other along the row direction, and the transistors TR2c and TR2d are aligned with each other along the row direction. The transistor string including the transistors TR2a and TR2b and that including the transistors TR2c and TR2d are displaced from each other by a single impurity region (impurity regions 2d, 2e and 2f are identical in size to each other). Therefore, the impurity regions 2e and 2f of the transistor TR2a connected to the output node ND and the power supply node respectively are faced to the impurity regions 2d and 2e of the transistor TR2c connected to the power supply node and the output node ND respectively through field insulating films respectively.

Similarly, the impurity regions 2e and 2f of the transistor TR2b are faced to the impurity regions 2d and 2e of the transistor TR2d through field insulating films (not shown) respectively. In case of arranging second transistors in two rows and two columns, no impurity regions for forming field transistors are particularly provided in the transistor strings. The transistors TR2a, TR2b, TR2c and TR2d are so arranged that the impurity regions connected to the power supply node are faced to those connected to the output node ND through the field insulating films, whereby field transistors are parasitically formed between these transistor strings and no additional impurity regions need be formed for forming field transistors. In the arrangement shown in FIG. 12, therefore, the layout occupied area can be remarkably reduced.

An impurity region 16m for forming a field transistor is formed in the exterior of the transistors TR2a and TR2b, and an impurity region 16n for forming a field transistor is arranged in the exterior of the transistors TR2c and TR2d. In the planar layout of the transistors TR2a to TR2d, gate electrode layers are connected to receive the control signals φA to φD independently of each other. However, connection of these gate electrode layers with respect to the control signals φA to φD may be properly determined depending on the control mode for charging/discharging the output node ND.

FIG. 12 shows second transistors arranged in two rows and two columns. However, a similar effect can be attained by repetitively arranging second transistors in a plurality of rows and a plurality of columns while displacing the transistors from each other by a single impurity region along the column direction similarly to the embodiment 3 shown in FIG. 10. Necessity for additional impurity regions for forming field transistors is reduced as the number of the transistors is increased, to significantly reduce the layout area.

According to the embodiment 4 of the present invention, as hereinabove described, the second transistors having the outer-side impurity regions connected to the power supply node are arranged in the row and column directions and displaced from each other by a single impurity region so that the impurity regions connected to the power supply node are faced to those connected to the output node in the column direction, whereby no impurity regions for forming field transistors are required between the transistor strings and the layout area can be remarkably reduced.

[Embodiment 5]

Figure 13:
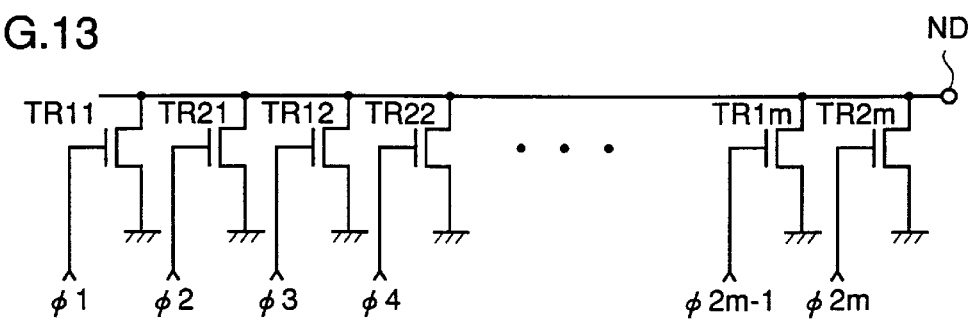
FIG. 13 illustrates an electric equivalent circuit of a semiconductor device according to an embodiment 5 of the present invention.

FIG. 13 illustrates an electric equivalent circuit of a semiconductor device (output circuit final stage) according to an embodiment 5 of the present invention. Referring to FIG. 13, a plurality of transistors TR11 to TR1m and TR21 to TR2m are connected between an output node ND and a power supply node (a ground node) in parallel with each other and receiving control signals φ1 to φ2m at the gates thereof respectively. Each of the transistors TR11 to TR1m is formed by the first transistor TR1 shown in FIGS. 1A to 1B, and each of the transistors TR21 to TR2m is formed by the second transistor TR2 shown in FIGS. 2A and 2B. The control signals φ1 to φ2m are activated/inactivated at different timings.

Figure 14:
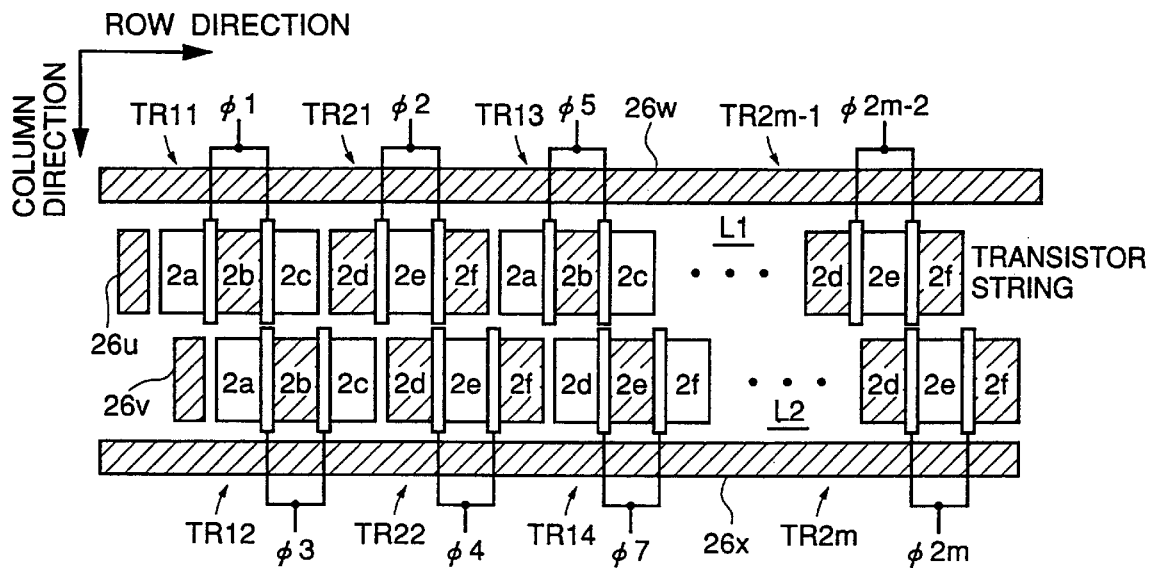
FIG. 14 schematically illustrates the planar layout of the semiconductor device according to the embodiment 5 of the present invention.

FIG. 14 illustrates the planar layout of the semiconductor device according to the embodiment 5 of the present invention. Referring to FIG. 14, first transistors TR1 having impurity regions 2a and 2c connected to the output node ND and second transistors TR2 having outer-side impurity regions connected to the power supply node are alternately arranged and aligned with each other along the horizontal direction (the row direction). In each of transistor strings L1 and L2, the first and second transistors TR1 and TR2 are alternately arranged in the same order. Between these transistor strings L1 and L2, however, the transistors are displaced from each other by a single impurity region. In the transistor string L1 having the transistors TR11, TR21, TR13, . . . , TR2m-1 and the transistor string L2 having the transistors TR12, TR22, TR14, . . . , TR2m, the impurity regions connected to the power supply node are faced to those connected to the output node ND through field insulating films (not shown).

For example, the impurity regions 2b and 2c of the transistor TR11 connected to the power supply node and the output node ND respectively are faced to the impurity regions 2a and 2b connected to the output node ND and the power supply node of the transistor TR12 of the adjacent string L2 respectively through field insulating films (not shown). Thus, a parasitic field transistor is formed in these regions. An impurity region 26w connected to the power supply node is arranged in the exterior of the transistors TR11, TR21, TR13, . . . , TR2m-1, for forming field transistors with the impurity regions 2a, 2c and 2e of these transistors TR11, TR21, TR13, . . . , TR2m-1 connected to the output node ND. Further, an impurity region 26x connected to the power supply node extends in the exterior of the transistor string L2 having the transistors TR12, TR22, TR14, . . . , TR2m along the row direction. Field transistors are formed between the impurity regions 2a, 2c and 2e connected to the output node ND of the transistors TR12, TR22, TR14, . . . , TR2m and the impurity region 26x. In the transistor strings L1 and L2, impurity regions 26u and 26v connected to the power supply node for forming field transistors are arranged adjacently to the impurity regions 2a connected to the output node ND.

As shown in FIG. 14, the first and second transistors TR1 and TR2 are alternately arranged in each of the transistor strings L1 and L2. Therefore, no impurity regions for forming field transistors are required in the transistor strings L1 and L2. Between the adjacent transistor strings L1 and L2, the transistors TR11 to TR2m are displaced from each other by a single impurity region. Between the transistor strings L1 and L2, therefore, the impurity regions connected to the power supply node are faced to those connected to the output node ND through field insulating films (not shown), so that no impurity regions for forming field transistors are required between the transistor strings L1 and L2 and the layout area can be remarkably reduced. In case of arranging a plurality of transistor strings, the two transistor strings L1 and L2 shown in FIG. 14 are repetitively arranged along the vertical direction (column direction).

In the structure shown in FIG. 14, the control signals φ1 to φ2m are supplied to gate electrode layers of the transistors TR11, TR21, . . . , TR2m-1 and TR2m respectively. Alternatively, these control signals φ1 to φ2m may be identical to each other, or may be properly dispersed to the gate electrode layers of the transistors TR11, TR21, . . . , TR2m-1 and TR2m to appropriately establishing the current suppliability of the transistors depending on charge/discharge control for the output node ND.

[Embodiment 6]

Figure 15:
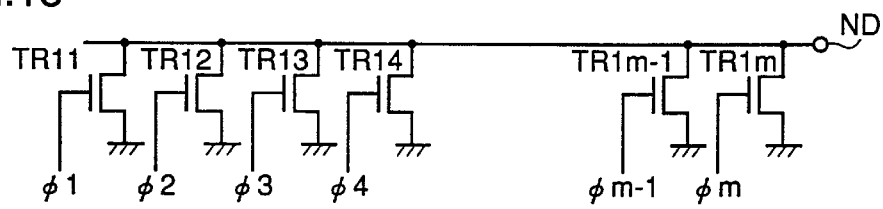
FIG. 15 schematically illustrates an electric equivalent circuit of a semiconductor device according to an embodiment 6 of the present invention.

FIG. 15 illustrates an electric equivalent circuit of a semiconductor device (output circuit final stage) according to an embodiment 6 of the present invention. Referring to FIG. 15, the output circuit final stage includes transistors TR11 to TR1m connected between an output node ND and a power supply node (ground node) in parallel with each other and receiving control signals φ1 to φm at the gates thereof respectively. Each of these n-channel MOS transistors TR11 to TR1m is formed by the first transistor TRI shown in FIGS. 1A and 1B.

Figure 16:
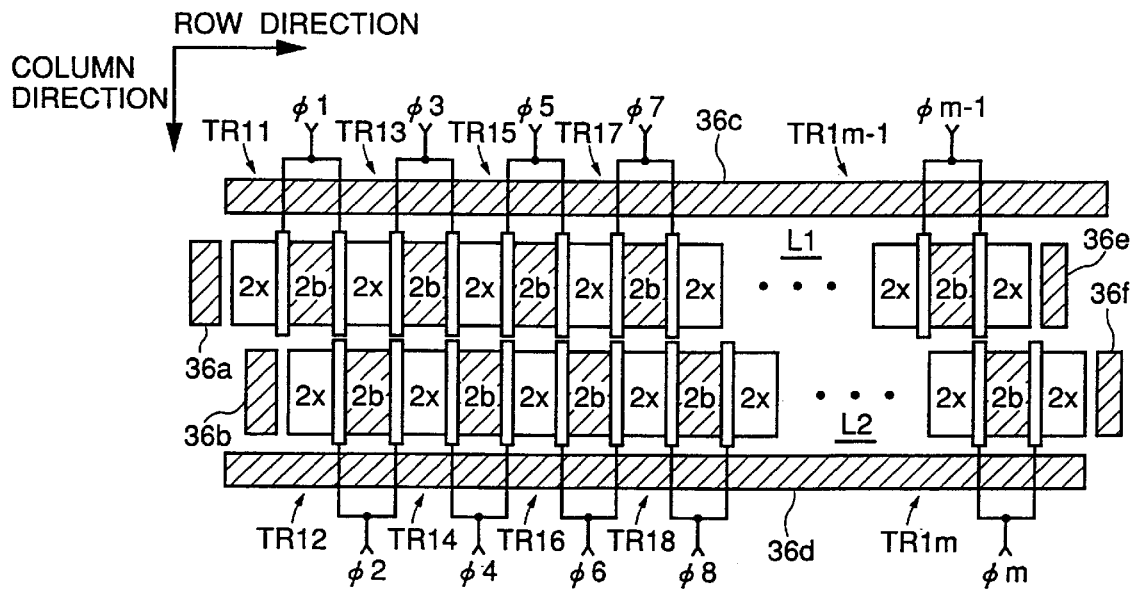
FIG. 16 schematically illustrates the planar layout of the semiconductor device according to the embodiment 6 of the present invention.

FIG. 16 schematically illustrates the planar layout of the semiconductor device according to the embodiment 6 of the present invention. Referring to FIG. 16, the transistors TR11, TR13, TR15, . . . , TR1m-1 are aligned with each other, and the transistors TR12, TR14, TR16, TR18, . . . , TR1m are aligned with each other. The transistors TR11 to TR1m-1 and TR12 to TR1m forming transistor strings L1 and L2 are so displaced from each other that impurity regions 2b connected to the power supply node are faced to impurity regions 2x connected to the output node ND through field insulating films.

In the transistor string L1, impurity regions 36a and 36e connected to the power supply node for forming field transistors are arranged in the exterior of the impurity regions 2x connected to the output node ND, while impurity regions 36b and 36f for forming field transistors are arranged in the exterior of the transistor string L2 adjacently to the impurity regions 2x connected to the output node ND. An impurity region 36c connected to the power supply node is arranged in the exterior of the transistor string L1 in parallel therewith, and an impurity region 36d connected to the power supply node is arranged in the exterior of the transistor string L2 through a field insulating film (not shown).

In the transistor strings L1 and L2, the transistors TR11 to TR1m-1 and TR12 to TR1m are displaced from each other. Therefore, the impurity regions 2b connected to the power supply node are faced to the impurity regions 2x connected to the output node ND. Thus, field transistors are parasitically formed between the transistor strings L1 and L2 with no requirement for impurity regions for forming the field transistors, and the layout area is reduced.

In the embodiment 6 of the present invention, further, adjacent transistors of the transistors TR11 to TR1m-1 and TR12 to TR1m share the impurity regions 2x connected to the output node ND in the transistor strings L1 and L2. Each impurity region 2x is shared by two transistors, whereby only one contact hole is required for each pair of transistors and the layout area is remarkably reduced in the alignment direction (row direction). Further, the impurity regions 2x connected to the output node ND are shared by the adjacent transistors, whereby the total occupied area by the impurity regions 2x connected to the output node ND can also be reduced. Current drivability of each of the transistors TR11 to TR1m-1 and TR12 to TR1m is determined by the ratio of the width to the length of the channel also in case of sharing the impurity regions 2x. Thus, the transistors TR11 to TR1m-1 and TR12 to TR1m each can be provided with desired current drivability.

According to the embodiment 6 of the present invention, as hereinabove described, the first transistors having the impurity regions connected to the output node ND are aligned with each other while the transistors adjacent to each other along the direction perpendicular to the alignment direction are displaced from each other such that the impurity regions connected to the power supply node are faced to those connected to the output node through field insulating films, whereby no impurity regions are required for forming field transistors and the layout area is remarkably reduced. Further, the impurity regions connected to the output node are shared by adjacent transistors, whereby the total occupied area by the impurity regions can be remarkably reduced.

[Embodiment 7]

Figure 17:
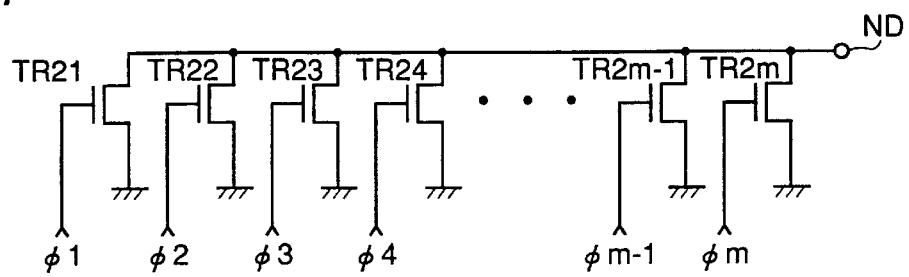
FIG. 17 schematically illustrates an electric equivalent circuit of a semiconductor device according to an embodiment 7 of the present invention.

FIG. 17 illustrates an electric equivalent circuit of a semiconductor device according to an embodiment 7 of the present invention. Referring to FIG. 17, the semiconductor device according to the embodiment 7 of the present invention includes n-channel MOS transistors TR21 to TR2$m$ connected between an output node ND and a power supply node (ground node) in parallel with each other and receiving control signals $\phi 1$ to $\phi m$ at the gates thereof respectively. Each of the transistors TR21 to TR2$m$ is formed by the second transistor TR2 shown in FIGS. 2A and 2B having the outer-side impurity regions connected to the power supply node.

Figure 18:
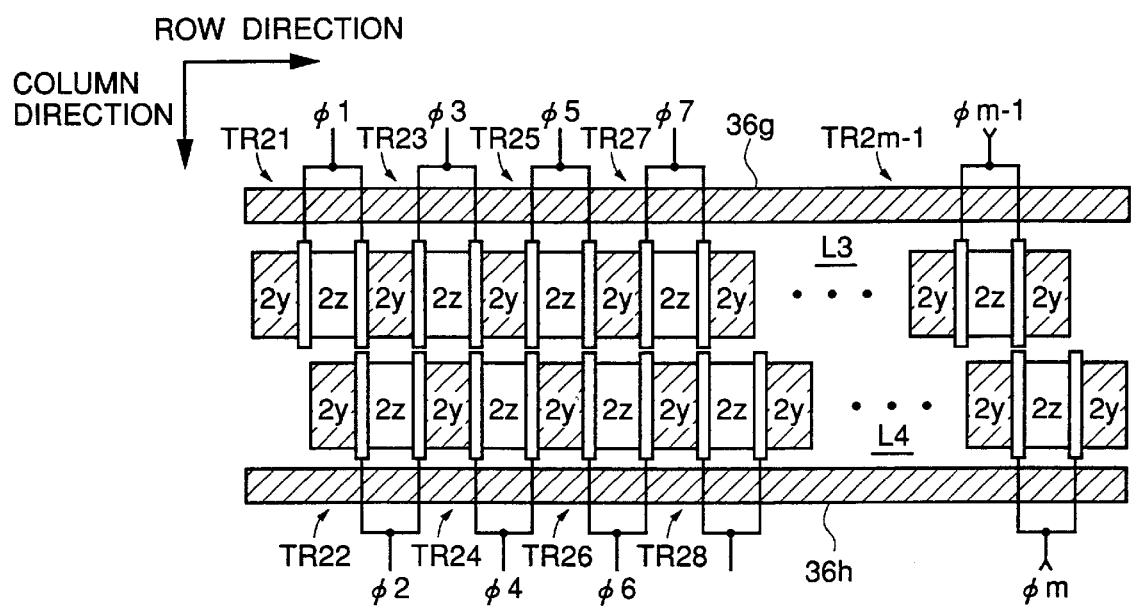
FIG. 18 schematically illustrates the planar layout of the semiconductor device according to the embodiment 7 of the present invention.

FIG. 18 illustrates the planar layout of the semiconductor device according to the embodiment 7 of the present invention. Referring to FIG. 18, the transistors TR21 to TR2$m$ are arranged in two rows, and form transistor strings L3 and L4. The transistors TR21 to TR2$m$ included in the transistor strings L3 and L4 are shifted in position from each other such that impurity regions 2$y$ connected to the power supply node are faced to impurity regions 2$z$ connected to the output node ND through field insulating films (not shown).

In the transistor strings L3 and L4, further, adjacent ones of the transistors TR21 to TR2$m$ share the impurity regions 2$y$ connected to the power supply node. The impurity regions 2$z$ connected to the output node ND are provided for the respective transistors TR21 to TR2$m$. Also in the structure shown in FIG. 18, an impurity region 36$g$ connected to the power supply node is arranged in the exterior of the transistor string L3 along the alignment direction (row direction) with a field insulating film (not shown) arranged therebetween, while an impurity region 36$h$ connected to the power supply node is arranged in the exterior of the transistor string L4 along the alignment direction with a field insulating film (not shown) arranged therebetween, to form field transistors with the impurity regions 2$z$.

Also in the structure shown in FIG. 18, no impurity regions for forming field transistors are required between the transistor strings L3 and L4. The impurity regions 2$y$ connected to the power supply node are arranged facing to the impurity regions 2$z$ connected to the output node ND through the field insulating films, thereby forming parasitic field transistors. In each of the transistor strings L3 and L4, adjacent ones of the transistors TR21 to TR2$m$ share the impurity regions 2$z$, whereby only one impurity region 2$z$ can be provided for each pair of adjacent transistors and the area of the transistor strings L3 and L4 along the alignment direction can be reduced.

Figure 19:
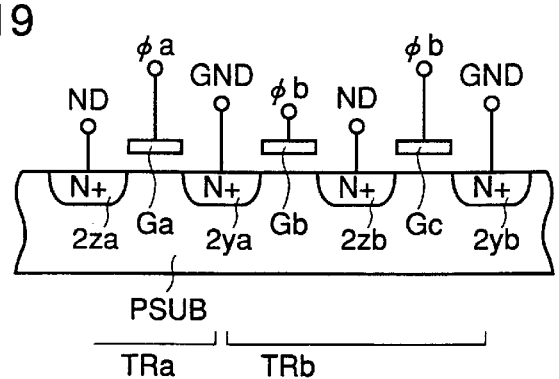
FIG. 19 schematically illustrates the sectional structure of adjacent transistors of the semiconductor device shown in FIG. 18.
Figure 20:
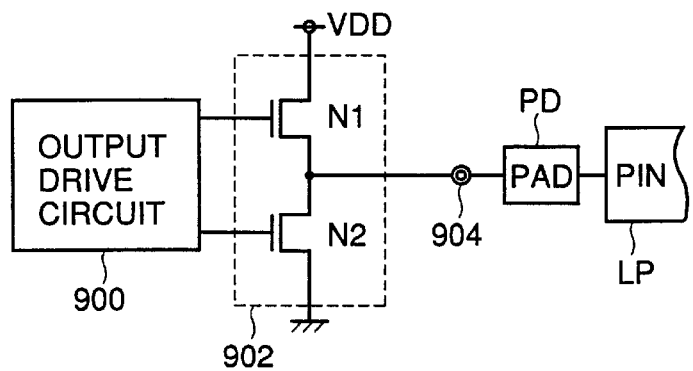
FIG. 20 schematically illustrates the structure of a conventional output circuit.
Figure 21:
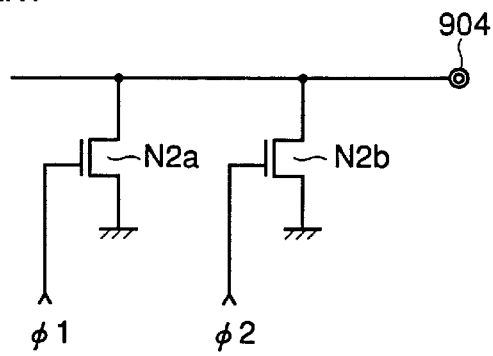
FIG. 21 illustrates an exemplary structure of a conventional output circuit final stage.
Figure 22:
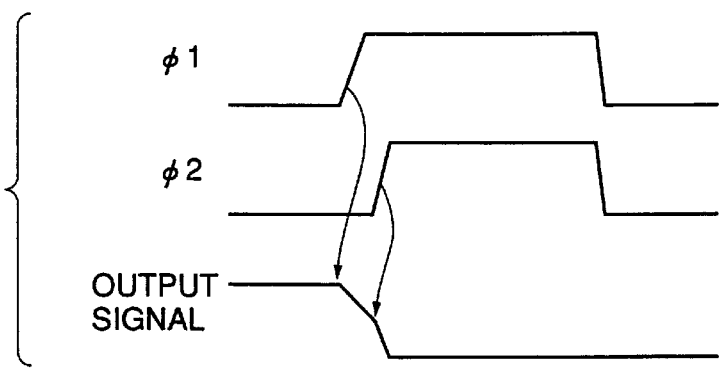
FIG. 22 is a signal waveform diagram representing the operation of the circuit shown in FIG. 21.
Figure 23:
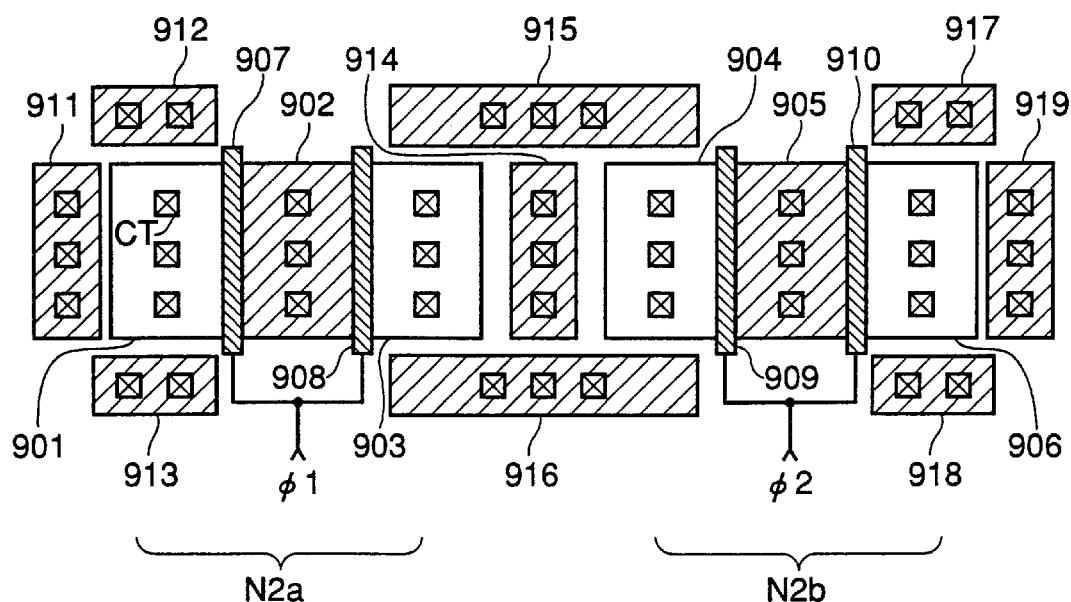
FIG. 23 schematically illustrates the planar layout of the conventional output circuit final stage.
Figure 24:
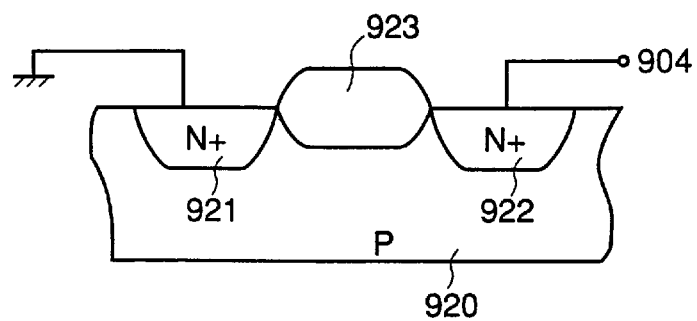
FIG. 24 schematically illustrates the sectional structure of a field transistor.

FIG. 19 schematically illustrates the sectional structure of transistors adjacently arranged in each transistor string. Referring to FIG. 19, impurity regions 2$za$, 2$ya$, 2$zb$ and 2$yb$ are spacedly arranged on a p-type semiconductor substrate region PSUB. Gate electrode layers Ga, Gb and Gc are arranged on channel regions between the impurity regions 2$za$ and 2$ya$, between the impurity regions 2$ya$ and 2$zb$ and between the impurity regions 2$zb$ and 2$yb$ respectively with gate insulating films (not shown) underlaid.

The impurity regions 2$za$ and 2$zb$ are connected to output node ND, while the impurity regions 2$ya$ and 2$yb$ are connected to power supply node GND. The gate electrode layers Ga, Gb and Gc receive control signals $\phi a$, $\phi b$ and $\phi c$ respectively. As clearly understood from the structure shown in FIG. 19, the four impurity regions 2$za$, 2$ya$, 2$zb$ and 2$yb$ can form two transistors TRa and TRb. Each of the impurity regions 2$ya$ and 2$yb$ is shared by two transistors. Current drivabilities of the transistors TRa and TRb is decided by the ratios between the widths and lengths of channels formed under the gate electrode layers Ga, Gb and Gc. If the gate electrode layers Ga, Gb and Gc have sufficient channel widths, the current drivability of each of the transistors TRa and TRb remains unchanged also in case of sharing the impurity regions 2$ya$ and 2$yb$, and the occupied area can be reduced without reducing the operating performance.

According to the embodiment 7 of the present invention, as hereinabove described, the transistors having the outer-side impurity regions connected to the power supply node are aligned with each other and arranged in a plurality of strings and shifted in position from each other over these strings, whereby the impurity regions connected to the power supply node are faced to those connected to the output node between the transistor strings resulting in parasitical formation of field transistors. Thus, no impurity regions are required for forming the field transistors, and the layout area is reduced. Further, the adjacent ones of the transistors share the impurity regions in each of the transistor strings, whereby the total occupied area by the impurity regions is reduced and therefore the size in the alignment direction can be remarkably reduced.

In the structure shown in FIG. 18, the transistors are aligned with each other in two strings. However, a larger number of transistor strings may be employed. The layout area can be advantageously reduced as the number of the transistor strings is increased.

Also in the structure shown in FIG. 18, the gate electrode layers of the transistors are supplied with different control signals. However, the control signals are properly supplied to the gate electrode layers depending on the driving speed of the output node ND as described above, and all gates may be supplied with the same control signal.

[Other Application]

In the above description of each embodiment, field transistors are provided for discharging MOS transistors for discharging the output node ND. In case of providing field transistors for MOS transistors (either p-channel or n-channel MOS transistors) for charging the output node ND, a similar effect can be attained by employing a similar layout.

As hereinabove described, the semiconductor device according to the present invention includes the first transistors having the outer-side impurity regions connected to the output node and the second transistors having the outer-side impurity regions connected to the power supply node, whereby field transistors can be parasitically formed in arrangement of the transistors, resulting in remarkable reduction of the layout area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first transistor including a first impurity region connected to a reference voltage source supplying a prescribed voltage and second impurity regions arranged adjacently to both sides of said first impurity region in a first direction and connected to a prescribed node; and
    a second transistor including a third impurity region arranged aligned with said first transistor along said first direction and connected to said prescribed node and fourth impurity regions arranged adjacently to both sides of said third impurity region in said first direction and connected to said reference voltage source.

2. The semiconductor device in accordance with claim 1, wherein the first and second transistors are alternately arranged along said first direction.

3. The semiconductor device in accordance with claim 1, wherein the first and second transistors are alternately arranged along said first direction to form a first transistor string, and alternately arranged in the first direction and adjacently to said first transistor string along a second direction perpendicular to said first direction such that the impurity regions of said first transistor string connected to said prescribed node are faced to and aligned with the impurity regions connected to said reference voltage source along said second direction, to form a second transistor string.

4. The semiconductor device according to claim 3, wherein the first and second transistor strings are alternately arranged in the second direction.

5. A semiconductor device comprising:
a first transistor string including a plurality of first transistors aligned with each other in a first direction, each of the first transistors including a first impurity region connected to a first node and second impurity regions connected to a second node and arranged adjacently to both sides of said first impurity region in said first direction; and
a second transistor string arranged adjacently to said first transistor string in a second direction perpendicular to said first direction and including a plurality of second transistors aligned with each other along said first direction, each of said plurality of second transistors of said second transistor string including a third impurity region connected to said first node and fourth impurity regions arranged adjacently to both sides of said third impurity region in said first direction and connected to said second node;
said plurality of second transistors of said second transistor string being arranged such that the third impurity regions are faced to the second impurity regions of said first transistors of said first transistor string in said second direction, adjacent second transistors in said second transistor string share the fourth impurity regions, and
one of the first and second nodes being connected to a reference voltage source.

6. The semiconductor device according to claim 5, further comprising fifth impurity regions arranged surrounding the first and second transistor strings and coupled to the reference voltage source.

7. The semiconductor device according to claim 5, wherein the other of the first and second nodes is a node for outputting a signal.

8. A semiconductor device comprising:
a first transistor string comprising a plurality of first transistors arranged alignedly with each other along a first direction, each of the first transistors including a first impurity region connected to a reference voltage source and second impurity regions connected to a first node and arranged adjacently to both sides of said first impurity region in said first direction;
a third impurity region arranged between adjacent first transistors in said first transistor string and connected to said reference voltage source;
a second transistor string arranged adjacently to said first transistor string in a second direction perpendicular to said first direction and including a plurality of second transistors arranged alignedly with each other along said first direction, each of the second transistors including a fourth impurity region connected to said reference voltage source and fifth impurity regions arranged adjacently to both sides of said fourth impurity region in said first direction and connected to said first node, said plurality of second transistors of said second transistor string being so arranged that the fourth impurity regions face to either said second impurity regions of said plurality of first transistors of said first transistor string or said third impurity region in said second direction; and
a sixth impurity region arranged between adjacent second transistors of said second transistor string to be faced to the second impurity regions of said first transistor string and connected to said reference voltage source.

9. The semiconductor device in accordance with claim 8, wherein said third and sixth impurity regions are enclosed with field insulating films.

10. The semiconductor device in accordance with claim 8, wherein the first and second transistor strings are arranged alternately by predetermined numbers respectively in the second direction.

11. The semiconductor device in accordance with claim 8, wherein the first and second transistor strings are surrounded by additional impurity regions connected to the reference voltage source.

12. The semiconductor device in accordance with claim 8, wherein the first node is a node for externally outputting a signal.

13. The semiconductor device in accordance with claim 5, wherein the first transistors of the first transistor string arranged adjacently in said first direction share the second impurity region, and the second transistors arranged adjacently with each other in the first direction share the fourth impurity regions.

* * * * *